United States Patent
Yin et al.

(10) Patent No.: US 11,336,227 B2
(45) Date of Patent: May 17, 2022

(54) FREQUENCY SYNTHESIZER WITH PHASE NOISE TEMPERATURE COMPENSATION, COMMUNICATION UNIT AND METHOD THEREFOR

(71) Applicant: NXP USA, INC., Austin, TX (US)

(72) Inventors: Yi Yin, Munich (DE); Birama Goumballa, Larra (FR); Baptiste Barroue, Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/113,378

(22) Filed: Dec. 7, 2020

(65) Prior Publication Data

US 2021/0175850 A1 Jun. 10, 2021

(30) Foreign Application Priority Data

Dec. 10, 2019 (EP) ..................................... 19306619

(51) Int. Cl.
*H03B 5/04* (2006.01)
*G01S 7/35* (2006.01)
*H03B 5/12* (2006.01)
*H03L 7/099* (2006.01)
*H03L 1/02* (2006.01)
*H04B 1/69* (2011.01)

(52) U.S. Cl.
CPC .................. *H03B 5/04* (2013.01); *G01S 7/35* (2013.01); *H03B 5/1228* (2013.01); *H03B 5/1231* (2013.01); *H03B 5/1296* (2013.01); *H03L 1/02* (2013.01); *H03L 7/099* (2013.01); *H03B 2200/009* (2013.01); *H04B 1/69* (2013.01); *H04B 2001/6912* (2013.01)

(58) Field of Classification Search
CPC .. H03B 5/04; H03L 7/099; H03L 1/00; H03L 1/02
See application file for complete search history.

(56) References Cited

U.S. PATENT DOCUMENTS 6,342,798 B1  1/2002 Yoshida
7,154,349 B2  12/2006 Cabanillas
(Continued)

OTHER PUBLICATIONS

Padovan, F., "A K-band SiGe Bipolar VCO with Transformer-Coupled Varactor for Backhaul Links", 13th Topical Meeting on Silicon Monolithic Integrated Circuits in RF Systems, Jan. 21-23, 2013.
(Continued)

*Primary Examiner* — Ryan Johnson (57) ABSTRACT

A frequency synthesizer is described that includes: a voltage controlled oscillator, VCO; a VCO bias circuit, operably coupled to the VCO and configured to provide a controllable bias current of the VCO; a temperature sensor, located in the frequency synthesizer, configured to determine an operating temperature of the frequency synthesizer; an analog-to-digital converter, ADC, operably coupled to the temperature sensor and configured to provide a digital representation of the determined operating temperature; and a bias control circuit operably coupled and configured to provide a bias control signal to the VCO bias circuit based on the determined operating temperature of the frequency synthesizer. The VCO bias circuit is configured to adjust the controllable bias current applied to the VCO based on the bias control signal.

18 Claims, 7 Drawing Sheets

(56) References Cited

U.S. PATENT DOCUMENTS

| | | | |
|---|---|---|---|
| 9,960,733 B2 * | 5/2018 | Motz | H03K 3/0231 |
| 10,191,453 B2 | 1/2019 | Pavlovic et al. | |
| 2012/0326797 A1 | 12/2012 | Chiu et al. | |
| 2013/0009473 A1 * | 1/2013 | Ponton | H03B 5/1228 |
| | | | 307/43 |
| 2013/0106476 A1 | 5/2013 | Joubert et al. | |
| 2013/0257547 A1 * | 10/2013 | Arai | H03L 7/099 |
| | | | 331/18 |
| 2014/0077890 A1 | 3/2014 | Babaie et al. | |
| 2015/0219753 A1 * | 8/2015 | Salle | G01S 7/4008 |
| | | | 342/174 |
| 2018/0372843 A1 * | 12/2018 | Greslehner-Nimmervoll | |
| | | | G01S 7/4017 |
| 2019/0379326 A1 | 12/2019 | Yin et al. | |

OTHER PUBLICATIONS

Rottava, R., "Ultra-low-power, ultra-low-voltage 2.12 GHz Colpitts oscillator using inductive gate degeneration", I11th International New Circuits and Systems Conference (NEWCAS), Jun. 16-19, 2013.

* cited by examiner

FREQUENCY SYNTHESIZER WITH PHASE NOISE TEMPERATURE COMPENSATION, COMMUNICATION UNIT AND METHOD THEREFOR

CROSS-REFERENCE TO RELATED APPLICATIONS

This application claims the priority under 35 U.S.C. § 119 of European Patent application no. 19306619.8, filed on 10 Dec. 2019, the contents of which are incorporated by reference herein.

FIELD OF THE INVENTION

The field of the invention relates to a frequency synthesizer, communication unit and a method for phase noise temperature compensation. The field of the invention is applicable to, but not limited to, temperature compensation via automatic, digitally-controlled adjustment of voltage controlled oscillator (VCO) bias, say between intervals of signal transitions, in a communication unit, such as an automotive radar device.

BACKGROUND OF THE INVENTION

Modern automotive frequency-modulated continuous wave (FMCW) radar systems typically use a transceiver composed of a transmitter, a receiver, and a frequency synthesizer source. Automotive radar systems are typically operated in the 76-81 GHz frequency range, and therefore complex, sensitive very high frequency generation and conversion circuits are required.

In many present day wireless communication applications, a frequency synthesizer is used to facilitate the radio frequency communications and is often implemented by way of a phase locked loop (PLL) that often uses a crystal oscillator (XCO) as a reference signal that is used to control a voltage controlled oscillator (VCO). The frequency synthesizer generates (often referred to as 'synthesizes') an output radio frequency (sometimes referred to as a 'local oscillator') signal that is used in the transmission and/or reception of radio frequency signals. Frequency synthesizers are also used to generate the FMCW waveforms required by a radar transmitter.

Figure 1:
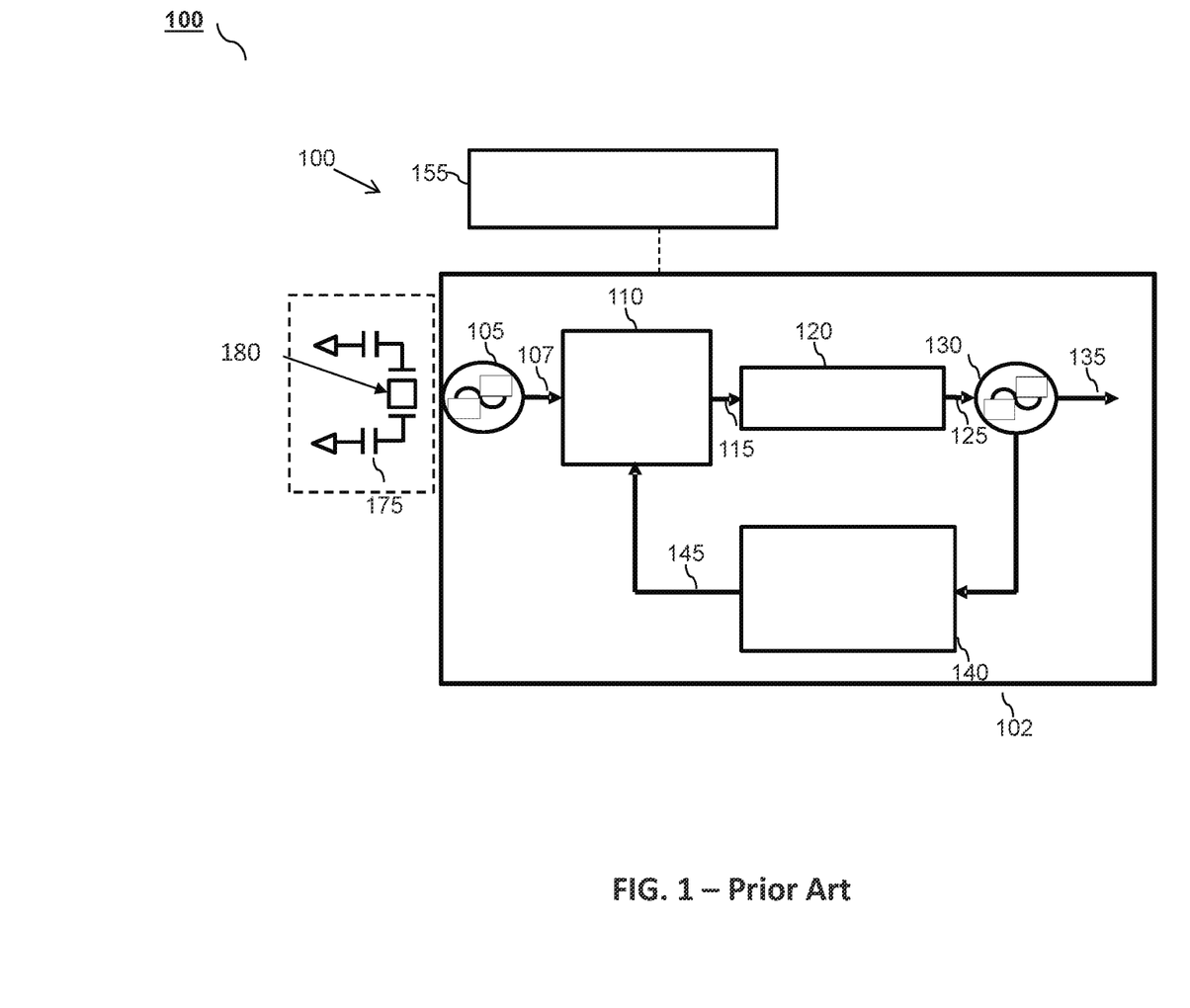
FIG. 1 illustrates a conventional phase locked loop block diagram.

FIG. 1 illustrates a conventional PLL design 100 for a radar device. A crystal oscillator 105 uses a crystal resonator 180 together with load capacitors 175 that, in combination, constitute the resonator. The crystal oscillator 105 generates a resonant input frequency 107 that is provided to frequency synthesizer 102 that includes a phase frequency detector (PFD) and charge pump (CP) 110, which compares a feedback signal 145 to the generated resonant input frequency 107, and outputs an oscillator control signal 115 based on the comparison of the feedback signal 145 to the generated resonant input frequency 107. A low pass loop filter 120 filters the oscillator control signal 115, and outputs a filtered oscillator control signal 125, which is provided to a VCO 130. The VCO 130 outputs a radio frequency signal 135 based on the filtered oscillator control signal 125. A feedback path of the PLL 100 consists of a frequency divider 140 that divides the output radio frequency signal 135 to generate a frequency-divided feedback signal 145, which is provided to the PFD and CP 110. Typically, in such frequency synthesizers 102 there is also a voltage regulator 155 to provide a constant DC voltage to the PLL circuits and components.

In a radar device, a phase noise of a transmitter is a key parameter, as phase noise is transferred into the noise density at a receiver intermediate frequency (IF) output. The VCO of a frequency synthesizer is typically the first (and therefore often the main) contributor of phase noise in high-frequency communication units/systems, such as radar systems. Whereas the primary parameter that causes VCO phase noise degradation is the wide temperature range (e.g. from −40 deg. to +125 deg. ambient temperatures) in an automotive radar system, it is also known that the PLL that uses the VCO also creates phase noise that limits the overall performance of the frequency synthesizer.

Thus, for most high-frequency applications, a lower phase noise specification is required. Therefore an improved frequency synthesizer is desired, particularly one that is able to operate over a wide temperature range.

SUMMARY OF THE INVENTION

The present invention provides a frequency synthesizer, a communication unit (such as a radar device) and a method for automatic, digitally-controlled phase noise temperature compensation, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the invention propose a frequency synthesizer and method, for example using idle time of signal transmission, to compensate phase noise degradation over temperature in a frequency synthesizer by adjusting a bias current of the Voltage Controlled Oscillator (VCO). Some examples of the invention propose to make the VCO adjustment using idle times between signal transmissions. Some examples of the invention propose to make the VCO adjustment based on a first validation data of phase noise over temperature information, for example to set a VCO biasing current digitally into a bias circuit. In some examples, the bias circuit is then able to remove a need for a root mean square (RMS) peak detector, which avoids a "kick back" of noise and a linearity degradation due to possible unstable signals during the signal transmission. Some examples of the invention propose to realize a quasi 'real time' temperature compensation VCO tuning approach by using an idle time slot between two chirps, or two frame transitions, as part of a calibration phase in a radar application, in order to avoid any linearity degradation during signal transmission. Some examples of the invention include a controller, a bias control circuit and a VCO bias circuit that is configured to control the VCO bias current in response to a control signal provided by circuitry that monitors an operating temperature of the frequency synthesizer. Furthermore, in some examples, the VCO bias current is arranged to change in response to changing the temperature of the frequency synthesizer.

In some examples, it is envisaged that the VCO bias current control, based on a temperature sensor signal may be initiated as part of safety sensors implemented in radar transceivers for automotive applications. Safety sensors are part of the safety mechanisms implemented in a system to detect and possibly mitigate any variation outside of a defined range that would lead to the violation of the system safety goals. In this manner, any variation of operating temperature of the VCO, for example used in a radar transceiver for automotive applications, can be detected and compensated for, advantageously in some examples before signal transmission. Thus, a potential out-of-band emission by the radar transceiver may be avoided.

Some examples of the present invention may provide a frequency synthesizer, a communication unit (such as a radar device) and a method for automatic, digitally controlled, phase noise temperature compensation. Some examples of the present invention may provide a frequency synthesizer by inserting digital controller and a table of bias control levels to be applied during intervals of idle transmission times of a communication unit, which in a context of a radar unit may be between two radar chirps, or two frames transmission.

Figure 2:
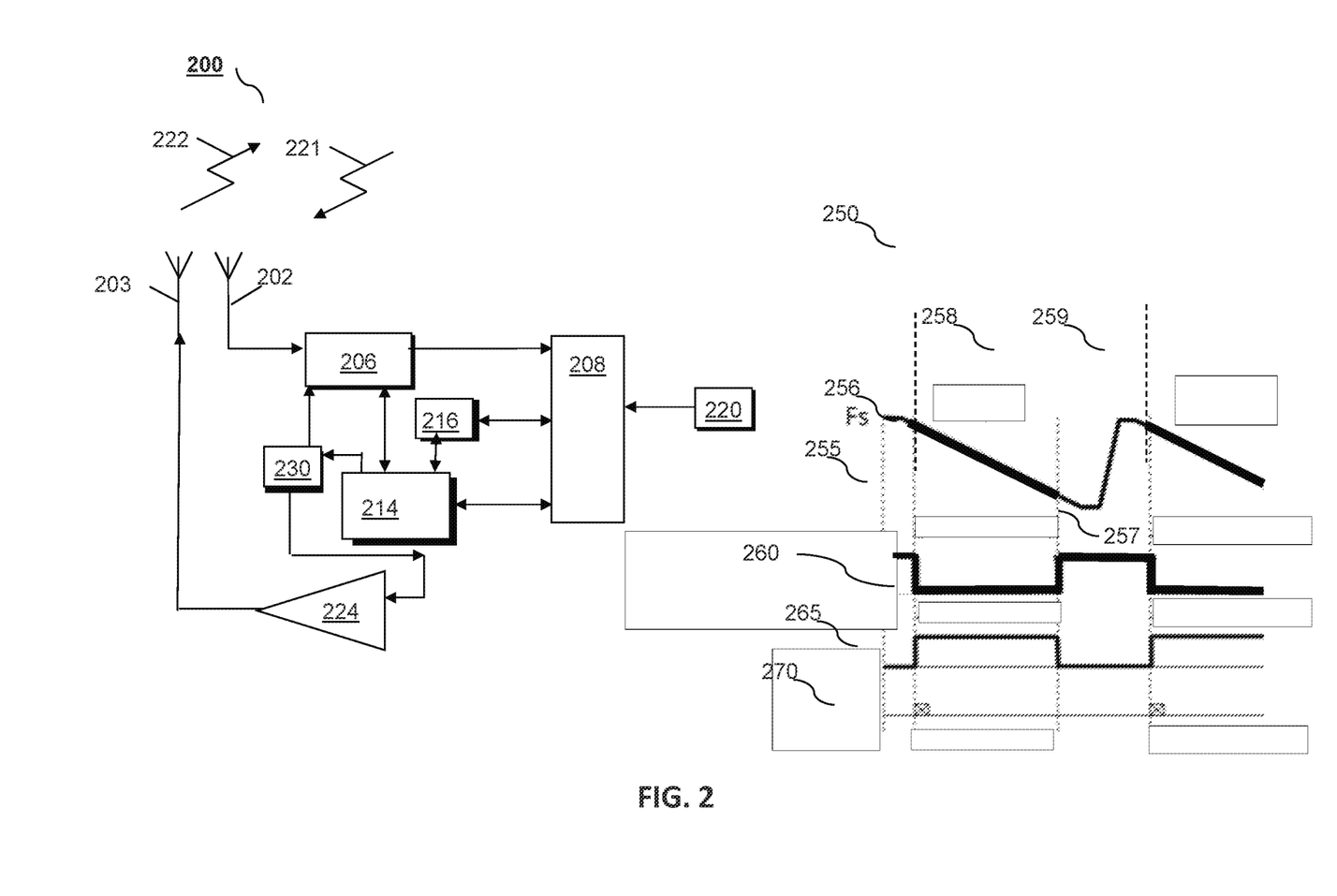
FIG. 2 illustrates a simplified block diagram of a communication unit, such as a radar device, and a mode of operation, adapted in accordance with examples of the invention.

Referring to FIG. 2, a block diagram of a wireless communication unit in a form of a radar device is shown, adapted in accordance with some examples of the invention. Purely for explanatory purposes, the wireless communication unit is described in terms of a radar device 200 operating at millimeter wave (MMW) frequencies, although it is envisaged that the frequency synthesizer concepts described herein apply equally to any communication unit that employs a frequency synthesizer.

The radar device 200 contains one or several antennas 202 for receiving radar signals 221, and one or several antennas 203 for transmitting radar signals 222, with one shown for each for simplicity reasons only. The number of antennas 202, 203 used may depend on the number of radar receiver and transmitter channels that are implemented in a given radar device. One or more receiver chains, as known in the art, include receiver front-end circuitry 206, effectively providing reception, frequency conversion, filtering and intermediate or base-band amplification, and finally an analog-to-digital conversion. In some examples, a number of such circuits or components may reside in signal processing module 208, dependent upon the specific selected architecture. The receiver front-end circuitry 206 is coupled to the signal processing module 208 (generally realized by a digital signal processor (DSP)). A skilled artisan will appreciate that the level of integration of receiver circuits or components may be, in some instances, implementation-dependent.

The controller 214 maintains overall operational control of the radar device 200, and in some examples may comprise time-based digital functions (not shown) to control the timing of operations (e.g. transmission or reception of time-dependent signals, FMCW modulation generation, etc.) within the radar device 200. The controller 214 is also coupled to the receiver front-end circuitry 206 and the signal processing module 208. In some examples, the controller 214 is also coupled to a memory device 216 that selectively stores operating regimes, such as decoding/encoding functions, and the like.

As regards the transmit chain, this essentially comprises a power amplifier (PA) 224 and possibly a phase shifter coupled to the transmitter's one or several antennas 203, antenna array, or plurality of antennas. In radar device 200, radar transceiver topology is different from traditional wireless communication architectures (e.g. Bluetooth™, Wifi™, etc.), as modulation occurs within a phase locked loop (PLL) (typically via a fractional-N divider), and is applied directly to the PA 224. Therefore, in some examples, the receiver front-end circuitry 206 and transmitter PA 224 are coupled to frequency generation circuit 230 arranged to provide local oscillator signals. The generated local oscillator signals are thus modulated directly to generate transmit radar signals, and also used to down-convert received modulated radar signals to a final intermediate or baseband frequency or digital signal for processing in a receive operation.

Figure 3:
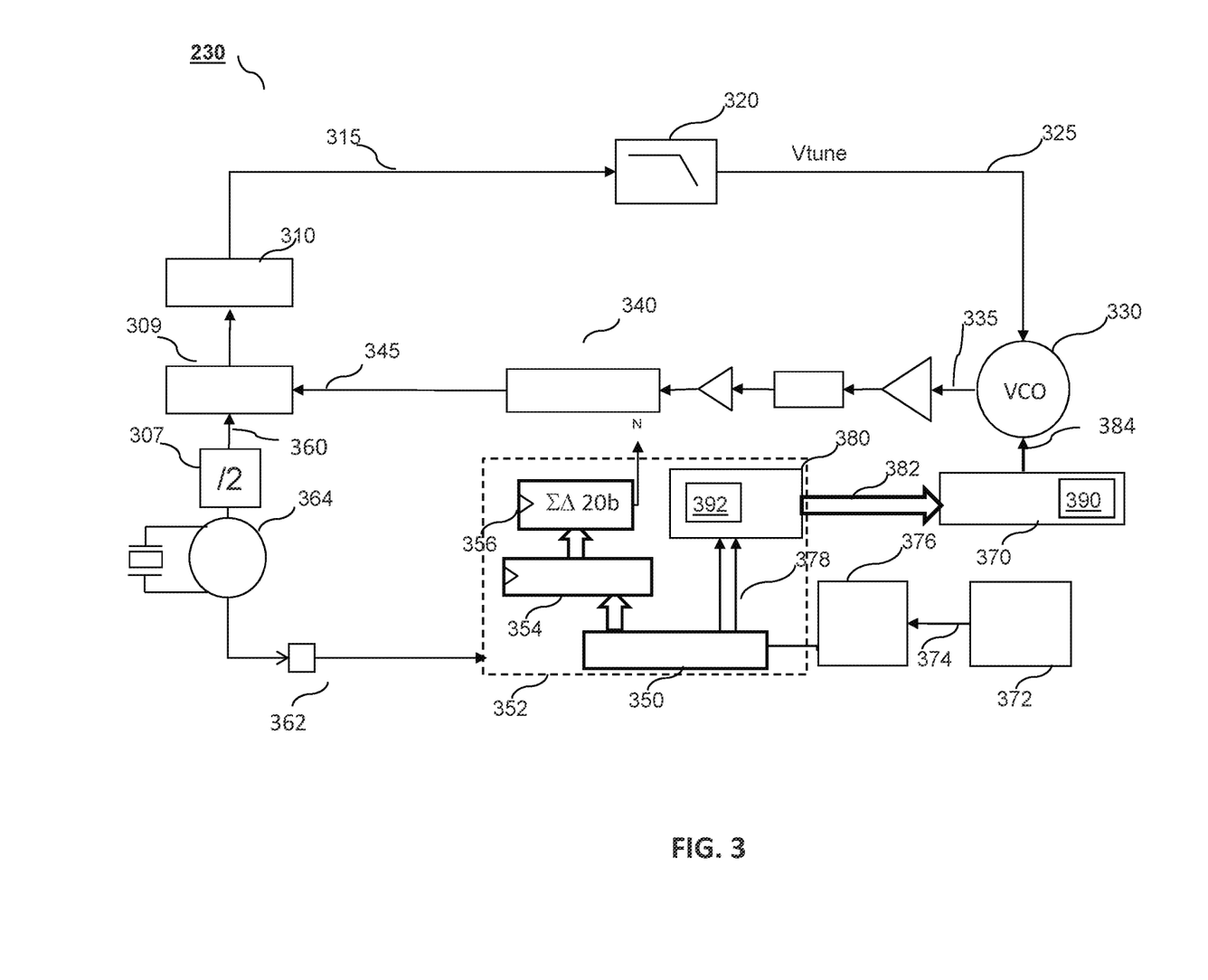
FIG. 3 illustrates a more detailed block diagram of a communication unit's frequency synthesizer, in accordance with examples of the invention.

In accordance with examples of the invention, frequency generation circuit 230 includes phase noise temperature compensation, composed of a VCO bias circuit, operably coupled to a VCO and configured to provide a control signal that controls a bias current of the VCO, as further described in the examples illustrated in FIG. 3. The frequency generation circuit 230 further includes a temperature sensor located in the frequency synthesizer (and preferably located close to the VCO) and configured to determine an operating temperature of the frequency synthesizer. An analog-to-digital converter, ADC, is operably coupled to the temperature sensor and configured to provide a digital representation of the determined operating temperature to a controller.

FIG. 2 also discloses a range of signals indicating modes of operation of the communication unit 200, which are described in terms of a radar device. A first signal 255 indicates a first radar transmission that transitions from a first frequency 256 to a second frequency 257 over a first chirp period 258, and then repeats after an idle period 259. The first chirp period, in some examples, is used as a calibration time period to determine an operating temperature of the frequency synthesizer. A second signal 260 represents a trigger applied to the temperature sensor, for example temperature sensor 372 of FIG. 3, the time period 259 of which is used to set the bias current of the VCO, as described herein after. A third signal 265 represents a trigger applied to the temperature ADC, for example temperature ADC 376 of FIG. 3, wherein the first chirp period 258 is used with the ADC enabled and the subsequent time period 259 of which is used to disable the ADC, as described herein after. A fourth signal 270 represents the data sampling of the ADC.

When the frequency synthesizer is employed in a wireless communication unit, instead of a radar device, the above signals may be applied to discontinuous transmissions, for example due to a time-division duplex mode of operation, as would be understood by persons skilled in the art.

In some examples, the controller may be used to apply the phase noise temperature compensation during idle time intervals between signal transitions. In some examples, the controller may be configured to determine and pre-save flexible bias coefficients as a digitally controlled lookup table, so that the bias control currents can be applied when needed to implement the desired phase noise temperature compensation. In some examples, the controller may be configured to determine and pre-save flexible bias coefficients based on a first applying a varying biasing current in a training operation and validating the bias current data by determining whether the phase noise of the VCO is minimized for particular bias currents. Thereafter, the stored bias currents from the lookup table may be selected based on the determined operating temperature of the frequency synthesizer.

In some examples, the bias current may be applied by using a control signal that adjusts a bias current at a VCO bias circuit that employs a binary-weighted current DAC. In this manner, in some examples, the phase noise degradation can be calibrated each time before signal transmissions, for example by resetting an optimized biasing current for VCO during the calibration (idle) phase of the communication unit, dependent upon the determined VCO operating temperature. Advantageously, in some radar unit examples, this may ensure a high linearity of the frequency chirps during a chirp transmission as there is no feedback compensation being disturbed by a chirp transmission.

A skilled artisan will appreciate that the level of integration of circuits or components may be, in some instances, implementation-dependent.

Referring now to FIG. 3, a more detailed block diagram 300 of a communication unit's frequency synthesizer is illustrated, in accordance with examples of the invention. The frequency synthesizer illustrates an example implementation of a phase locked loop (PLL) based frequency to voltage converter (FVC), in accordance with examples of the invention. The frequency synthesizer includes a VCO 330, a reference frequency, such as resonant input frequency 360, input from, say, a crystal oscillator 364 and having being applied to a divide-by-two circuit or component 307. The reference frequency 360 is provided to a phase frequency detector (PFD) 309 and charge pump (CP) 310, which compares a feedback signal 345 to the generated resonant input frequency 360, and outputs a control signal 315 based on the comparison there between. A low pass loop filter 320 filters the control signal 315, and outputs a filtered control signal 325, which is provided to the VCO 330. The VCO 330 outputs a radio frequency signal 335 to a feedback path of the PLL based on the filtered oscillator control signal 325. The feedback path 345 of the PLL is provided to the PFD 309 and CP 310 via a fractional N divider 340.

In this example, a controller circuit 352 of the PLL comprises a Ramp Generator configured to generate frequency modulated continuous wave (FMCW) frequency chirps, a sigma-delta (SD) modulator for PLL in-band noise suppression (for example a 20 bit SD modulator), a controller 350 configured to allocate time intervals for chirp transmissions and configured to allocate a VCO biasing calibration time during periods where there are no chirp transmissions. In some examples, bias control circuit 380 includes a digitally-controlled lookup table 392 that contains pre-saved bias coefficient, which have been identified, say during a training/calibration operation, such that selectable bias currents are known to minimize phase noise of the VCO at a particular determined temperature.

A temperature sensor 372, which is preferably located adjacent the VCO 330, is configured to monitor an operating temperature of the VCO and provide a determined temperature signal 374 to a temperature analog-to-digital converter, ADC, 376. The temperature ADC 376 is operably configured to provide, to the bias control circuit 380, a digital representation of the determined operating temperature of the VCO. The bias control circuit 380 is operably coupled to a VCO bias circuit 370 and configured to provide a bias control signal 382 to the VCO bias circuit 370, which in some examples is or comprises a binary-weighted current DAC 390, where the bias control signal 382 is based on the determined operating temperature of the frequency synthesizer and corresponding pre-set temperature compensation coefficients stored in the lookup table 392 in (or coupled to) bias control circuit 380 for use when sending the bias control signal 382 to the binary-weighted current DAC 390, wherein the bias control signal 382 adjusts a bias current 384 applied to the VCO 330. In some examples, the bias control signal 382 is configured to adjust the bias current 384 applied to the VCO 330 in a manner that compensates the phase noise degradation of a frequency synthesizer as it varies over and according to a changing temperature of the VCO 330 (frequency synthesizer). The digital control for the binary-weighted current DAC 390 is provided by a current bias circuit, which is controlled by a temperature ADC 376. In some examples, the temperature sensor is located close to the VCO 330, so as to better control the bias current 384 applied to the VCO 330 according to a determined temperature. In this manner, improved PLL phase noise can be achieved over temperature, e.g. for a vehicle radar application.

Although this example illustrates a use of a PFD 309 and CP 310 PLL based FVC, it is envisaged that in other examples a phase detector, such as an XOR logic gate, may be used.

Thus, a frequency synthesizer 230 is described that comprises a voltage controlled oscillator. VCO 330; a VCO bias circuit 370, operably coupled to the VCO 330 and configured to provide a controllable bias current 384 of the VCO 330. A temperature sensor 372 is located in the frequency synthesizer 230 and configured to determine an operating temperature of the frequency synthesizer 230; and an analog-to-digital converter, ADC 376, is operably coupled to the temperature sensor 372 and configured to provide a digital representation 378 of the determined operating temperature. A bias control circuit 380 operably coupled to the ADC 376 and the VCO bias circuit 370 and configured to provide a bias control signal 382 to the VCO bias circuit 370, based on the determined operating temperature of the frequency synthesizer 230. The VCO bias circuit 370 is configured to adjust the controllable bias current 384 applied to the VCO based on the bias control signal 382.

Examples of the present invention provide a frequency generation circuit that exhibits a reduced noise source that uses, for example, a number of inductive transmission lines. In some examples, the frequency generation circuit may be a Colpitts Voltage Controlled Oscillator (VCO), in order to achieve an improved phase noise and output power match within a small silicon area. In some examples, the overall phase noise can be further reduced over a wide temperature range of a frequency synthesizer by optimizing a current biasing of the oscillator (e.g. VCO) in response to a determined change in the temperature of the frequency synthesizer (e.g. VCO) by resetting the optimum biasing current during a transmission idle time interval. In some examples, the current biasing of the oscillator may be performed digitally.

Figure 4:
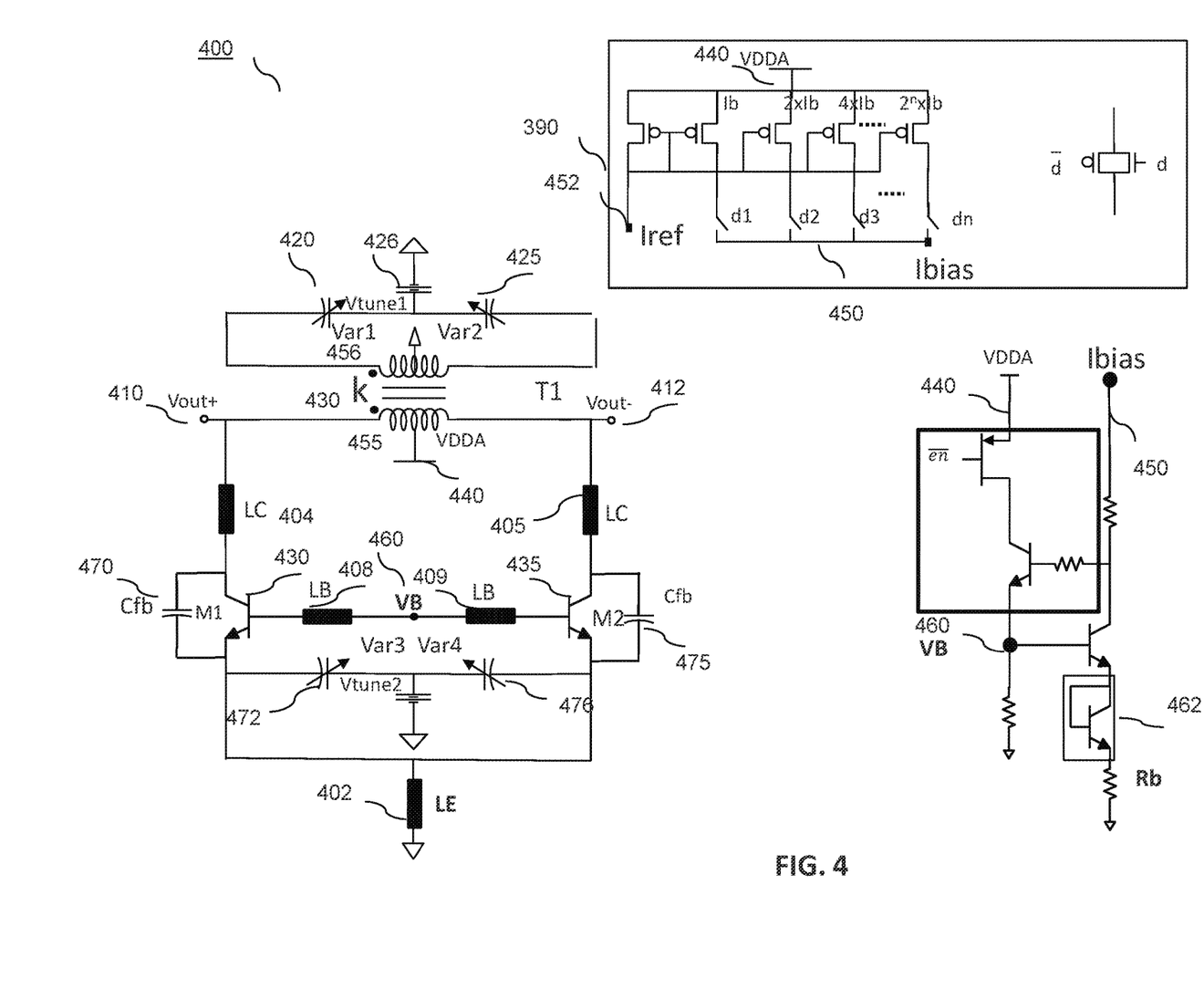
FIG. 4 illustrates a more detailed schematic circuit diagram of a communication unit's bipolar differential VCO with digital control biasing, in accordance with examples of the invention.

Referring now to FIG. 4, a more detailed schematic circuit diagram 400 of a communication unit's bipolar differential VCO with digital control biasing is illustrated, in accordance with examples of the invention. The differential oscillator 400 is a common-base Colpitts oscillator and takes a form of a differential oscillator circuit with positive and negative output terminals $V_{out+}$ 410 and $V_{out-}$ 415.

It should be noted that in the context of this specification, the VCO may comprise two components having the same amplitude and opposite phase. A differential signal may be provided via two terminals. For example, and as illustrated in FIG. 4, the differential VCO comprises two active devices, in this case first transistor 430 and second transistor 435. It is envisaged that, in other examples, any kind of transistor or suitable active device may be used. The active devices, respectively transistors 430 and 435, may be identical in respect to their properties to provide symmetrical active devices. In particular, the two active devices in the example of FIG. 4 are bipolar transistors 430 and 435; more particularly, the two active devices are bipolar junction transistors 430 and 435. In other examples, it is envisaged that the frequency synthesizer may use different transistors that are suitable for high frequencies as active devices, in particular NPN-transistors.

In the illustrated configuration, the bipolar transistors 430 and 435 form a balanced differential pair of bipolar transistors 430 and 435. The bases of transistor 430 and 435 may be connected to a biasing voltage $V_{bias}$. The biasing voltage $V_{bias}$ may be a direct (DC) biasing voltage $V_{bias}$, which may be referred to as common mode DC biasing voltage $V_{bias}$. The biasing voltage $V_{bias}$ may be provided by a biasing voltage source 460 coupled between the bases of the transistors 430 and 435 and a lowest reference potential such as ground. The biasing voltage $V_{bias}$ may be chosen in any suitable way to bias the base voltages of the transistors 430 and 435. In the illustrated example, the bases of the transistors 430 and 435 are coupled to each other and the basing voltage $V_{bias}$ is applied to the interconnected bases of the transistors 430 and 435.

In order to achieve a high tuning range to cover the two frequency bands for LRR and SRR, two separated varactor pairs 472-476 and 420-425 are used and decoupled from each other, not only through the transistors 430 and 435, but also the inductive transformers 456 and 455, which minimize the parasitic impact on the Q factor of the LC tank, so that a high Q factor can be achieved over a wide frequency range. In order to further ensure a low phase noise, the low noise biasing with low noise impedance at VB 460 is achieved by inserting a diode-connected MOS or transistor active device 462 and noise free transmission line LE 402 at a common emitter, which are used to set operation points.

In some examples, in order to achieve low phase noise across a high temperature range, a binary-weighted current DAC 390 may be controlled by bias control circuit 380 (which in some examples may use a lookup table 392 of pre-evaluated bias currents for particular VCO temperatures). In this manner, a suitable bias current value 450 may be selected from the lookup table 392 by bias control circuit 380 and based on the temperate value 374 determined by temperature sensor 372. In order to minimize phase noise of the frequency synthesizer the optimal current over temperature may have been determined in advance through a training or calibration process and saved as control coefficients in the lookup table 392 in bias control circuit 380.

Capacitors 470 and 475 are coupled in parallel to the collector-emitter path of transistors 430 and 435. The capacitor 470 and the capacitor 475 form positive feedback capacitors, each of which being connected to the collector and the emitter of a respective one of the transistors 430 and 435. The capacitors 470 and 475 provide a positive feedback from the emitter to the collector of the respective one of the transistors 430 and 435. In some examples, it is feasible to choose the capacitances of capacitors 470 and 475 to be equal.

A supply voltage $V_{dd}$ 440 is supplied to the coil 455; in particular the supply voltage $V_{dd}$ 440 is supplied to a center tap of the coil 455. For instance, the supply voltage $V_{dd}$ 440 may be 2.5 V, or lower, or higher (e.g. 3.3 V or 5 V).

The positive and negative output terminals $V_{out+}$ 410 and $V_{out-}$ 412 are coupled to the collectors of the respective one of the transistors 430 and 435.

The coil 455 is a first or primary coil of a transformer 450 comprising a second or secondary coil 456 inductively coupled with the coil 455. The second coil 456 is coupled in series to varactors 420 and 425, which capacitances are tunable by a tuning voltage $V_{tune1}$ control 426 provided by a tuning voltage source to the common interconnection net of the varactors 420 and 425. The tuning voltage $V_{tune1}$ control 426 is a direct voltage source or a current mirrored voltage e.g. provided by a current mirror circuit. The capacitance tuning of the varactors 420 and 425 is enabled by a single-ended tuning voltage $V_{tune1}$ control 426. It is feasible to choose the capacitances of varactors 420 and 425 to be equal. The varactors 420 and 425 may change the capacitance dependency to a changing tuning voltage $V_{tune1}$ control 426 over a suitable tuning voltage range. In the illustrated configuration, the varactors 420 and 425 are connected in series between a respective one of the end taps of the second coil 456. The centre tap of the second coil 456 is applied to a reference potential, and in particular, the centre tap of the second coil 456 is set to lowest reference potential such as ground, in order to achieve a maximal tuning range within a given supply.

The main frequency tuning of the differential oscillator is enabled by the transformer coupled varactor pair 420 and 425. The transformer coupled pair of varactors 420 and 425 enables a tuning of the oscillator frequency in the W-band. In particular, the transformer coupled pair of varactors 420 and 425 enables a tuning of the oscillator frequency in a frequency range, which comprises the long-range radar (LRR) frequency range (76-77 GHz) and the short-range radar (SRR) frequency range (77-81 GHz). The frequency tuning range of the differential oscillator is further expanded by the emitter side arranged varactor pair 472 and 476, which enables not only a wide tuning range for e.g. LRR and SRR application, but also compensation of any oscillation frequency drift due to process, supply and temperature variation (PVT).

Advantageously, the example frequency generation circuit can be configured such that a single VCO design is able to cover a dual band design, e.g. the LRR (76 GHz-77 GHz) and the SRR (77 GHz-81 GHz), in order to achieve this, the VCO may be configured to use the digital control bits in a binary-weighted-current DAC for the temperature compensation, e.g. to set the needed bias current for a low noise VCO core over a wide frequency range (e.g. across both frequency bands).

FIG. 4 also illustrates an example circuit to provide an adjustable, temperature-dependent bias current (Ibias) 450 for the VCO, e.g. VCO 330 in FIG. 3. In some examples, a flexible Ibias 450 over temperature may be achieved in order to minimize phase noise of the frequency synthesizer achieved by digital controlled binary-weight-current DAC 376.

FIG. 4 also illustrates an example circuit to provide a digital control for a temperature DAC, e.g. temperature DAC 376 of FIG. 3, shown in one example as a binary-weighted current DAC configured to provide an adjustable bias current 450. In one example, a temperature sensor 372 may be configured to use different current density of two different sizes of bipolar transistors $\Delta V=2U_T \ln(N)$. In some examples, a reference current (Iref) 452 provided to the binary-weight-current DAC 376 is trimmable (as example +−5%, +10% shown here), in order to generate Ibias 450. In some examples, a look-up table integrated in bias control circuit 380 may be used to select an Ibias to be used for particular ranges of determined temperatures. In some examples, characterization of the VCO and bias currents may be pre-determined in order to find an optimum biasing to use in order to reduce/compensate the phase noise across a wide temperature range. In some examples, a startup sequence may be updated accordingly to reflect different setup conditions of the frequency generation circuitry, when operating in a real-life application.

With respect to FIG. 4, an example of a differential oscillator is illustrated and described, which comprises bipolar transistors 430 and 435 as active devices. In particular, SiGe bipolar transistors 430 and 435 may offer desired high frequency characteristics. However, the implementation of a differential oscillator should not be understood to be limited to bipolar transistors 430 and 435 as active devices. MOS (n-type metal-oxide semiconductor) transistors and in particular NMOS (n-type metal-oxide semiconductor) transistors may be also used as active devices, as illustrated in FIG. 5.

Figure 5:
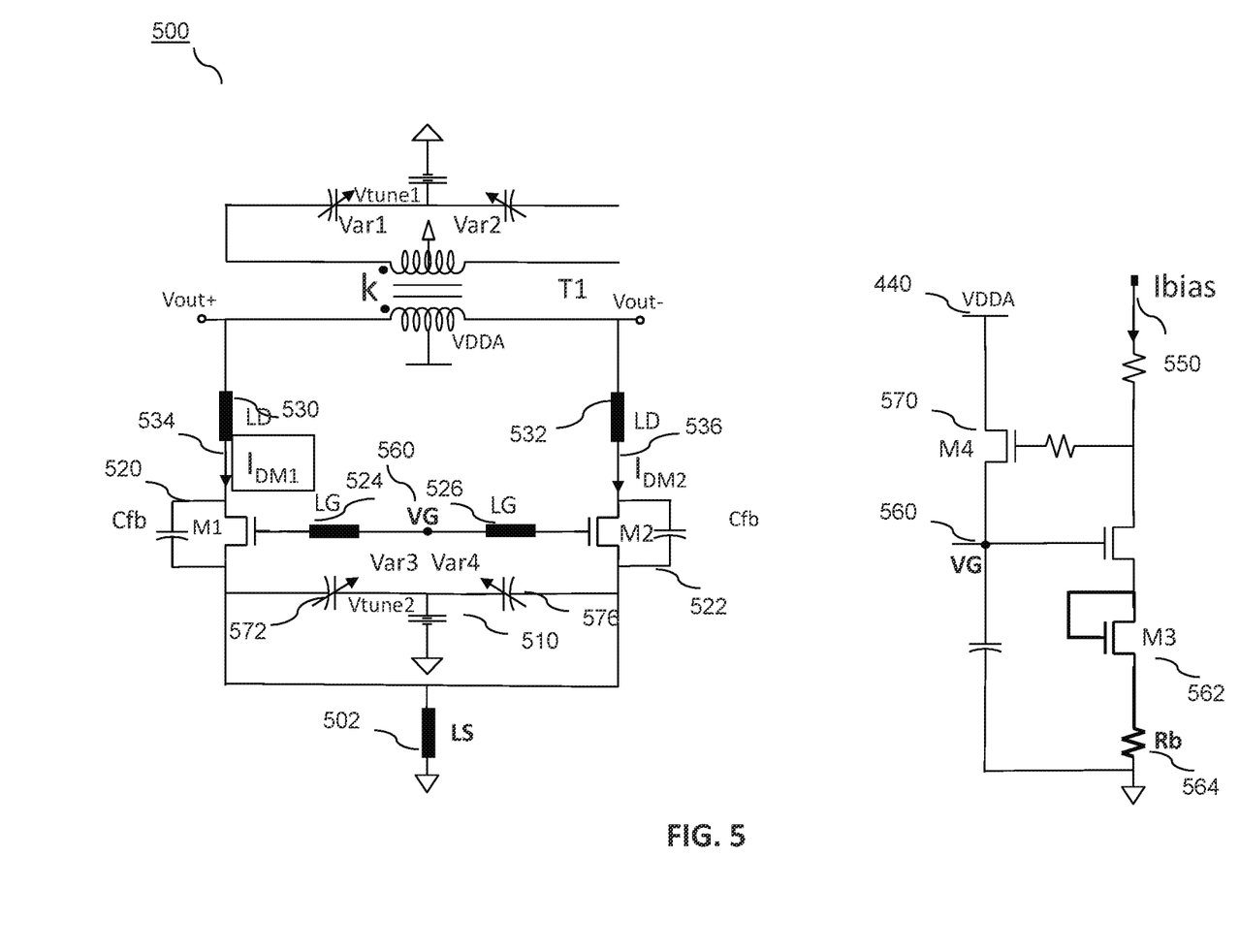
FIG. 5 illustrates a more detailed schematic circuit diagram of a communication unit's FET-based VCO with digital control biasing, in accordance with examples of the invention.

Referring now to FIG. 5, a more detailed schematic circuit diagram 500 of a communication unit's FET-based VCO with digital control biasing is illustrated, in accordance with some examples of the invention. The schematic circuit diagram 500 includes MOS transistors 530 and 535 as the active devices, which may be identical in respect to their properties to provide symmetrical active devices, and more particularly may be configured in a balanced configuration. Those skilled in the art will immediately understand that the terms 'collector', 'emitter' and 'base' used in the context of bipolar transistors translate to the corresponding terms 'drain', 'source' and 'gate' for MOS transistors. Thus, the detailed schematic circuit diagram 500 illustrates a FET-based VCO with digital control biasing that is similar to the bipolar schematic circuit diagram 400 of FIG. 4, so similar/same features will not be repeatedly described to avoid obfuscating the invention, provided that the technical terms relating to the terminals of the bipolar transistors 430 and 435 are translated into technical terms relating to the terminals of the MOS transistors 530 and 535.

In the schematic circuit diagram 500, the VCO is biased at the common-gate of the Colpitts VCO through a current mirror. An inductive degeneration is used at common source, which does not raise the noise level, as there is no active device or degeneration resistor that contribute noises. Thus, by proper sizing of the transmission line inductance LG, LD and LS, it is possible to obtain a noise and power match. LG, LD and LS are transmission lines that act as low-loss inductive devices at mm-wave frequencies and require a small silicon space. In this example, inductive LC compensated Cgate-drain, LG 524, 526 and varactors 572, 576 may be used to adjust the oscillation frequency. In some examples, LS 502 realizes a common source degeneration, to provide for a better stable output signal, which is better for a low phase noise.

In some examples, in order to lower the impedance at VG 560, a dioded connected M3 562 and low resistance Rb 564 may be used for minimizing the phase noise. VG 560 has low impedance: $1/gm_{M3}+Rb$. In order to low the impedance at VG 560, Ibias 550 is chosen to be similar $I_{DM1}$ 534 and $I_{DM2}$ 536 to have low $1/gm_{M3}+Rb$.

In some examples, the current bias 550 of the current mirror may be delivered by digitally controlling a binary-weighted current DAC, which is sized in order to achieve accurate current bias control for a lowest phase noise of VCO. The term 'sized' is used to describe the binary-weighted current DAC 1, 2 . . . 2^2 . . . . In this example, the reference current Iref is provided from a central biasing circuit (not shown), which in some examples is generated by a band-gap biasing circuity with a trimming possibility.

For the sake of a simpler description, the collector terminal and the drain terminal will be also referred to as a first current terminal, the emitter terminal and drain terminal will be also referred to as a second current terminal and the base terminal and gate terminal will be also referred to as a control terminal.

Figure 6:
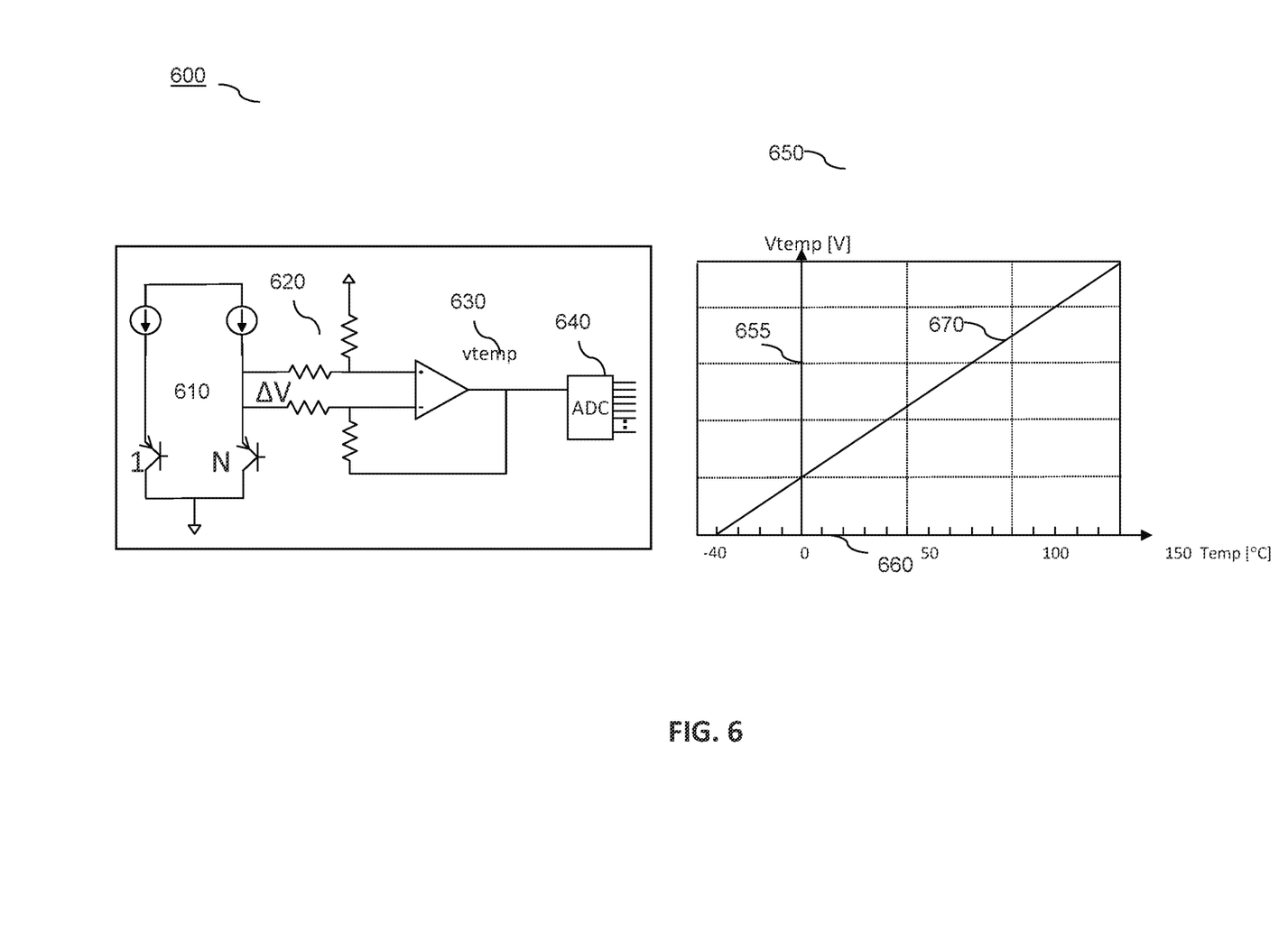
FIG. 6 illustrates a simple schematic circuit diagram of a communication unit's temperature sensor and amplifier and ADC arrangement, in accordance with some examples of the invention.

Referring now to FIG. 6, a simple schematic circuit diagram 600 of a communication unit's temperature sensor 610 and amplifier 620 is illustrated, in accordance with some examples of the invention. In this example, the temperature sensor 610 uses two lateral transistors, with a 1 to 'N' emitter (or source for MOS) area 610. In this example, the temperature sensor 610 may be configured to use different current density for two different sizes of bipolar transistors $\Delta V=2U_T \ln(N)$. In this example, 'N' is a ratio between the two emitter areas for bipolar (or source areas for MOS devices) as the temperature sensor 610. The amplifier 620 is configured to maximize the small temperature sensor voltage (Vtemp) to the full-scale input voltage range of the ADC 640. In this manner, the output from the ADC 640 delivers the chip ambient temperature information digitally to the controller, say controller 352 of FIG. 3. Together with control logic 350, controller 352 is able to activate the bias control circuit 380, for example after a certain time interval to select an optimal biasing current for VCO 330 in FIG. 3

A graph 650 illustrates an example relationship 670 of the amplified voltage representation 630 of the sensed temperature, with respect to the determined temperature voltage 655 vs. temperature 660.

Figure 7:
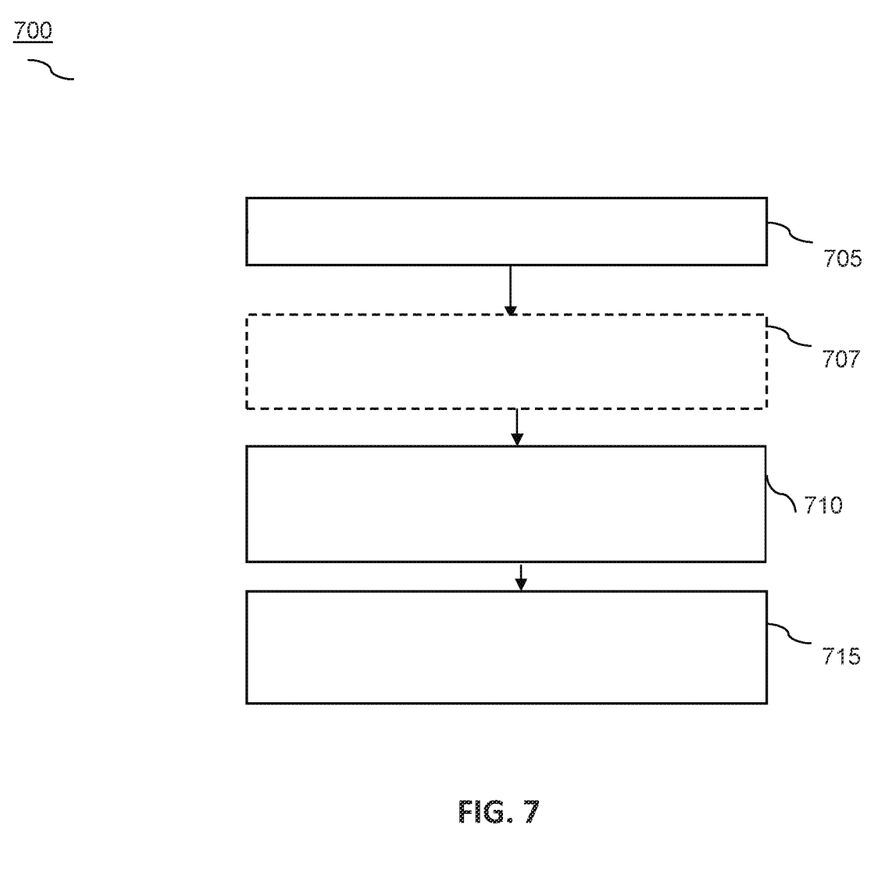
FIG. 7 illustrates an example flowchart of VCO tuning operation in a communication unit, in accordance with some example embodiments of the invention.

FIG. 7 illustrates an example flowchart 700 of a phase noise temperature compensation approach in a frequency synthesizer, such as frequency synthesizer 230 of FIG. 2, in accordance with some example embodiments of the invention. The flowchart 700 describes how an example frequency synthesizer works in accordance with some example embodiments of the invention including three operation modes. A first operational mode is a pre-set mode at 705, where bias current over temperature are measured and pre-saved, say in a look-up table. In some examples, the bias currents may include optimized control coefficients for a binary weighted DAC, for use by bias control circuit 380. At 707, a second (transmission) mode of operation includes radar signals being transmitted in a normal radar mode of operation, and an operating temperature of the frequency synthesizer continuously monitored and converted to a digital form. At 710, a third (idle) mode of operation occurs, where there is no radar transmission. Here, as there is no signals transition, the VCO is not actively functioning and new optimized current coefficients may be selected in order to reset VCO biasing current according to the prevalent VCO temperature at that time. In some examples, control logic 350 in FIG. 3 may be configured to select the different operational modes for the frequency synthesizer. For example, if control logic 350 determines to perform a bias current calibration, then it will set the frequency synthesizer to idle mode. Here, a digital representation 378 of the determined operating temperature is obtained and provided to a bias control circuit 380 and look-up table. The bias control circuit 380 then generates a control signal 382 and applies this to a VCO bias circuit 370. In this manner, the control signal 382 adjusts the controllable bias current 384 applied to the VCO by the VCO bias circuit 370 based on the determined operating temperature of the frequency synthesizer 230.

Because the illustrated embodiments of the present invention may, for the most part, be implemented using electronic components and circuits known to those skilled in the art, details have not been explained in any greater extent than that considered necessary, as illustrated below, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also for example, in one embodiment, the illustrated examples may be implemented as circuitry located on a single integrated circuit or within a same device. Alternatively, the circuit and/or component examples may be implemented as any number of separate integrated circuits or separate devices interconnected with each other in a suitable manner. Also for example, the examples described herein, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired anti-spying counter measures by operating in accordance with suitable program code, such as minicomputers, personal computers, notepads, personal digital assistants, electronic games, automotive and other embedded systems, commonly denoted in this application as 'computer systems'. However, it is envisaged that other modifications, variations and alternatives are also possible. The specifications and drawings are, accordingly, to be regarded in an illustrative, rather than in a restrictive, sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A frequency synthesizer comprising:
   a voltage controlled oscillator, VCO, the VCO is a differential VCO comprising a first transistor and a second transistor, a control terminal of the first transistor coupled to the control terminal of the second transistor;
   a first varactor pair and a separated second varactor pair RR, decoupled from each other via the first transistor and second transistor and inductive transformers;
   a VCO bias circuit, operably coupled to the VCO and configured to provide a controllable bias current of the VCO;
   a temperature sensor located in the frequency synthesizer and configured to determine an operating temperature of the frequency synthesizer;
   an analog-to-digital converter, ADC, operably coupled to the temperature sensor and configured to provide a digital representation of the determined operating temperature; and a bias control circuit operably coupled to the ADC and the VCO bias circuit and configured to provide a bias control signal to the VCO bias circuit, based on the determined operating temperature of the frequency synthesizer, wherein the VCO bias circuit is configured to adjust the controllable bias current applied to the VCO based on the bias control signal.

2. The frequency synthesizer according to claim 1 wherein the bias control circuit comprises or is operably coupled to a lookup table that is configured to store a plurality of bias current coefficients according to a plurality of operating temperature ranges of the frequency synthesizer wherein a level of the controllable bias current applied to the VCO for the determined operating temperature of the frequency synthesizer is obtained by the bias control circuit from the lookup table.

3. The frequency synthesizer according to claim 2 wherein the VCO bias circuit is or comprises a binary-weighted current digital-to-analog converter, DAC, controlled by the bias control circuit.

4. The frequency synthesizer according to claim 2 wherein the plurality of bias current coefficients comprise a plurality of pre-set bias current coefficients for binary temperature coefficients.

5. The frequency synthesizer according to claim 1 further comprising a controller operably coupled to bias control circuit and configured to initiate the control signal that adjusts the controllable bias current during an idle operation mode of the frequency synthesizer.

6. The frequency synthesizer according to claim 5, wherein the frequency synthesizer is employed in a radar device or a communication unit and wherein the controller is configured to initiate the control signal between two radar chirps of the radar device or two frame transitions of the communication unit to adjust the controllable bias current.

7. The frequency synthesizer according to claim 5, wherein the controller is configured to instigate three operational modes of the frequency synthesizer:
a first pre-set mode of operation arranged to determine a plurality of controllable bias currents to apply to the VCO by the VCO bias circuit based on a determined operating temperature of the frequency synthesizer;
a second transmission mode of operation arranged to generate a frequency for use by a radar device or a communication unit to at least transmit a radio frequency signal; and
a third idle mode of operation that is employed by the controller to update a bias current to apply to the VCO by the VCO bias circuit.

8. The frequency synthesizer according to claim 1 further comprising:
a diode-connected metal oxide semiconductor (MOS) or transistor active device operably coupled to the control terminal of the first transistor and to the control terminal of the second transistor and
a transmission line, LE located at a common emitter or common source.

9. The frequency synthesizer according to claim 1 wherein the first transistor and the second transistor comprise at least one of the following:
the first transistor is a first bipolar transistor and the second transistor is a second bipolar transistor wherein a first current terminal is a collector terminal, a second current terminal is a source terminal and the respective connected control terminals are base terminals;
the first transistor is a first metal-oxide semiconductor, MOS, transistor and the second transistor is a second MOS transistor wherein a first current terminal is a drain terminal, a second current terminal is a source terminal and the respective connected control terminals are gate terminals.

10. The frequency synthesizer according to claim 1 further comprising a biasing voltage source coupled to an interconnection of the control terminals of the first transistor and second transistor and arranged to supply a common biasing voltage ($V_{bias}$).

11. A communication unit having a frequency synthesizer comprising:
a voltage controlled oscillator, VCO, the VCO being a differential VCO comprising a first transistor and a second transistor, a control terminal of the first transistor coupled to the control terminal of the second transistor;
a first varactor pair and a separated second varactor pair RR, decoupled from each other via the first transistor and second transistor and inductive transformers;
a VCO bias circuit, operably coupled to the VCO and configured to provide a controllable bias current of the VCO;
a temperature sensor located in the frequency synthesizer and configured to determine an operating temperature of the frequency synthesizer;
an analog-to-digital converter, ADC, operably coupled to the temperature sensor and configured to provide a digital representation of the determined operating temperature; and
a bias control circuit operably coupled to the ADC and the VCO bias circuit and configured to provide a bias control signal to the VCO bias circuit, based on the determined operating temperature of the frequency synthesizer,
wherein the VCO bias circuit is configured to adjust the controllable bias current applied to the VCO based on the bias control signal.

12. The communication unit according to claim 11 wherein the bias control circuit comprises or is operably coupled to a lookup table that is configured to store a plurality of bias current coefficients according to a plurality of operating temperature ranges of the frequency synthesizer wherein a level of the controllable bias current applied to the VCO for the determined operating temperature of the frequency synthesizer is obtained by the bias control circuit from the lookup table.

13. The communication unit according to claim 12 wherein the VCO bias circuit is or comprises a binary-weighted current digital-to-analog converter, DAC, controlled by the bias control circuit.

14. The communication unit according to claim 11 further comprising a controller operably coupled to bias control circuit and configured to initiate the control signal that adjusts the controllable bias current during an idle operation mode of the frequency synthesizer.

15. The communication unit according to claim 14 wherein the communication unit is a radar device and wherein the controller is configured to initiate the control signal between two radar chirps of the radar device to adjust the controllable bias current.

16. A method for phase noise temperature compensation in a frequency synthesizer comprising:
determining an operating temperature of the frequency synthesizer;
providing a digital representation of the determined operating temperature;

generating a control signal and applying the control signal to a VCO bias circuit based on the determined operating temperature of the frequency synthesizer;

providing a controllable bias current to a voltage controlled oscillator, VCO by the VCO bias circuit, the VCO being a differential VCO comprising a first transistor and a second transistor, a control terminal of the first transistor coupled to the control terminal of the second transistor, a first varactor pair and a separated second varactor pair RR, decoupled from each other via the first transistor and second transistor and inductive transformers;

adjusting the controllable bias current applied to the VCO by the VCO bias circuit based on the bias control signal.

17. The method according to claim 16, further comprising instigating three operational modes of the frequency synthesizer:

instigating a first pre-set mode of operation for determining a plurality of controllable bias currents to apply to the VCO by the VCO bias circuit based on a determined operating temperature of the frequency synthesizer;

instigating a second transmission mode of operation for generating a frequency for use by a radar device or a communication unit to at least transmit a radio frequency signal; and instigating a third idle mode of operation that is employed by the controller for updating a bias current to apply to the VCO by the VCO bias circuit.

18. The method according to claim 16 further comprising initiating the control signal that adjusts the controllable bias current during an idle operation mode of the frequency synthesizer.

* * * * *